United States Patent [19]

Bolgiano

[11] 4,001,708

[45] Jan. 4, 1977

[54] CODE-CONTROLLED RINGER ATTACHMENT FOR TELEPHONES INCLUDING A-PEAK-TO-PEAK GAIN CONTROLLED AMPLIFIER

[75] Inventor: Duane Ridgely Bolgiano, Bala Cynwyd, Pa.

[73] Assignee: International Mobile Machines Corporation, Philadelphia, Pa.

[22] Filed: Sept. 4, 1975

[21] Appl. No.: 610,127

Related U.S. Application Data

[62] Division of Ser. No. 496,450, Aug. 12, 1974, Pat. No. 3,936,617.

[52] U.S. Cl. .............................. 330/29; 179/1 A; 330/127; 330/129
[51] Int. Cl.² ....................................... H03G 3/30
[58] Field of Search ............... 179/1 A; 330/29, 32, 330/127, 129; 307/235 A; 333/14

[56] References Cited

UNITED STATES PATENTS

| | | | |
|---|---|---|---|
| 2,999,169 | 9/1961 | Feiner | 330/29 X |
| 3,496,383 | 2/1970 | Tomsa | 330/32 X |
| 3,747,005 | 7/1973 | Freimark et al. | 330/29 X |

Primary Examiner—James B. Mullins
Assistant Examiner—Lawrence J. Dahl
Attorney, Agent, or Firm—Arthur A. Jacobs

[57] ABSTRACT

A system for selectively deactivating a telephone bell on a telephone instrument whereby when a telephone number is called, an auxiliary system automatically cuts in to prevent ringing of the bell until a predetermined code is dialed or touch-toned, at which time the telephone bell is actuated.

2 Claims, 8 Drawing Figures

CODE-CONTROLLED RINGER ATTACHMENT FOR TELEPHONES INCLUDING A PEAK-TO-PEAK GAIN CONTROLLED AMPLIFIER

This is a division of co-pending application Ser. No. 496,450, filed Aug. 12, 1974, now U.S. Pat. No. 3,936,617.

This invention relates to an attachment for a telephone and it particularly relates to an attachment which selectively permits ringing of the telephone bell in accordance with the dialing of a specific code.

It is often desirable to avoid answering undesirable calls but to immediately recognize a call which is desired to be answered. An unlisted number is usually now used for this purpose; however, not only may an unlisted number be discovered in one manner or another but if a legitimate caller forgets the number, he may not be able to place the call even if it is important to the person being called.

This problem was, heretofore, substantially solved by placing an attachment on the telephone whereby even though the number was listed, the telephone bell at the receiving end would only ring when a certain identifying code was additionally dialed. However, this prior type of an attachment had certain inherent disadvantages. For example, a relay was used which was left in an open condition until such time as the proper code was received. This was not only unreliable because of stresses which might inadvertantly close the relay, but consumed in inordinate amount of energy.

This prior device was also utilizable, only in a three-wire system used in party lines. However, the majority of single-party phones used today utilize only two wires instead of the three wires provided in the prior device, the ringing signal and the voice signal being both provided across the same pair.

Another disadvantage of the prior device was its use of phase-locked loops which not only required a considerable expenditure of energy but were not sufficiently stable and also made the system unduly complex and expensive.

It is one object of the present invention to overcome the aforesaid disadvantages by providing a system wherein the bell is prevented from ringing with a normally closed relay which is both more reliable and consumes less energy than a normally open relay.

Another object of the present invention is to provide a system of the aforesaid type which is capable of use in a two-wire system.

Another object of the present invention is to provide a system of the aforesaid type which accomplishes the same function as one using phase-locked loops but with a considerably smaller expenditure of energy and with greater stability.

Another object of the present invention is to provide a system of the aforesaid type which employs only two detectors.

Other objects and many of the attendant advantages of this invention will be readily appreciated as the same becomes better understood by reference to the following description when read in conjunction with the accompanying drawings wherein.

Figure 1:
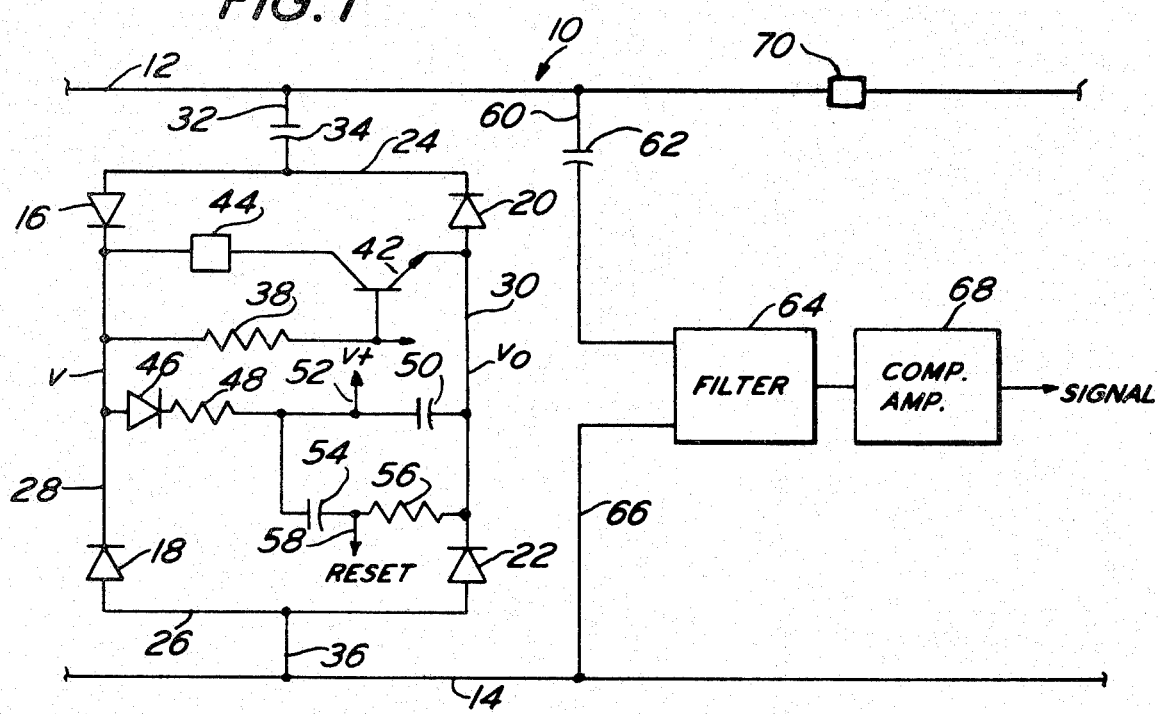
FIG. 1 is a schematic view of a bell ringer circuit embodying the present invention, said circuit being deactivated when a specific code signal is detected.

Referring now in greater detail to the figures of the drawings wherein similar reference characters refer to similar parts, there is shown in FIG. 1 a circuit, generally designated 10, comprising a pair of telephone wires respectively designated 12 and 14, wire 12 being a red wire and wire 14 being a green wire, these wires being connected to the telephone transmission line (not shown). Between the wires 12 and 14 is a bridge rectifier consisting of diodes 16, 18, 20 and 22, the diodes 16 and 20 being connected by line 24, the diodes 18 and 22 being connected by line 26, the diodes 16 and 18 being connected by line 28 and the diodes 20 and 22 being connected by line 30. The line 24 is coupled to wire 12 by a line 32 having a capacitor 34 interposed therein, and the line 26 is coupled to wire 14 by line 36.

Positioned across line 28 and 30 is a resistor 38 connected to a flip-flop (hereinafter described in FIGS. 3 and 4), this flip-flop acting as a switch means in the manner hereinafter described. The resistor 38 is also coupled to a transistor 42 in series with a normally closed relay 44. The relay acts to open and close the circuit between the phone line and the telephone instrument. Also positioned between the lines 28 and 30 is a circuit comprising a rectifier 46 in series with a resistor 48 and a capacitor 50. An output is provided at 52. A parallel circuit is provided between resisitor 48 and line 30 comprising a capacitor 54 and a resistor 56 with an output at 58 for acting as a reset means for the flip-flops hereinafter described.

The wire 12 is also capacitively coupled through line 60 and capacitor 62 to a filter 64 which is, itself, coupled through line 66 to the wire 14. The filter 64 is also coupled to a compression amplifier 68. The contacts 70 of relay 44 are provided in the line 12 leading to the voice receiver (not shown).

In operation, when a ringing signal appears between the wires 12 and 14, the signal is passed through capacitor 34 and the bridge rectifier consisting of rectifiers 16, 18, 20 and 22, whereby a unidirectional pulsating voltage (full wave rectified DC) appears between lines 28 and 30. If the flip-flop, hereinafter described, which acts as a switch, opens the circuit, the resistor 38 causes transistor 42 to saturate so that relay 44 operates to disconnect the phone instrument from the phone line, thereby preventing the bell in the instrument from operating. If, conversely, the circuit is closed, then transistor 42 would be cut off, the relay 44 would not operate and the phone instrument would be connected to the phone line, permitting the bell in the instrument to operate normally. Similarly, if there is no ringing signal across the line, then there is no voltage available to operate the relay 44 regardless of the condition of the transistor 42; therefore, the phone instrument is normally connected to the phone line for normal incoming and outgoing calls in the absence of a ringing signal on the line.

When there is a ringing signal on the line causing a voltage to appear between lines 28 and 30, some current is conducted through the rectifier 46 and resistor 48 to charge capacitor 50. Normally, there is a four-second interval between ringing signals and the energy stored in capacitor 50 is employed during these intervals to provide operating power for all the other elements in the system. If the relay 44 is sensitive, the total energy taken from the phone line during a ringing signal can be made identical to the energy which would have been used by the bell if it had been ringing. Since the entire circuit is capacitively coupled by means of capacitor 34 to the phone line, the circuit is not polarity sensitive and, therefore, the lines 12 and 14 may be interchanged at will.

When a tone is sent through the phone line, it is coupled via capacitor 62 into the filter 64 which is coupled to the compression amplifier 68. The filter removes all frequencies except the predetermined desired frequencies. The undesirable frequencies which are removed would be all those other frequencies which are typically sent through the line by telephone companies.

Since different phone lines have differing attenuation characteristics, signals coming down the line arrive with differing amplitudes. The compression amplifier senses the acutal amplitude of the signal tone and adjusts the gain of the amplifier portion so that when the tone leaves the compression amplifier, it will always have the same amplitude regardless of the amplitude of the signal entering the compression amplifier.

The filter 64 and compression amplifier are not essential for the operation of the system but substantially increase its reliability.

Figure 2:
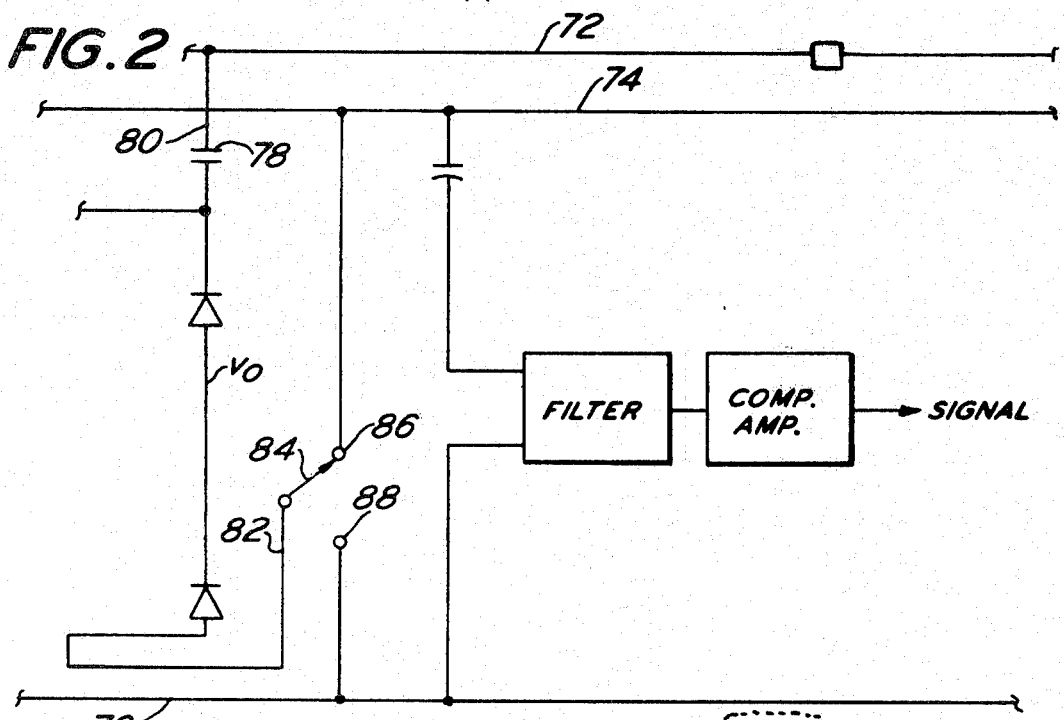
FIG. 2 is a schematic view of a modified portion of the circuit of FIG. 1.

FIG. 2 discloses the same system as FIG. 1 except that it is used in a three-wire system which includes three wires, 72, 74 and 76, which are respectively, the yellow, green and red wires. The bridge, which is otherwise identical to that in FIG. 1, is capacitively coupled to line 72 by capacitor 78 interposed in line 80. A line 82 connects the bridge to a switch 84 that may be manually operated. This switch 84 is movable between two contacts 86 and 88 to selectively couple the rectifier bridge either to the wire 74 or to the wire 76. All other parts are identical to those in FIG. 1.

Figure 3:
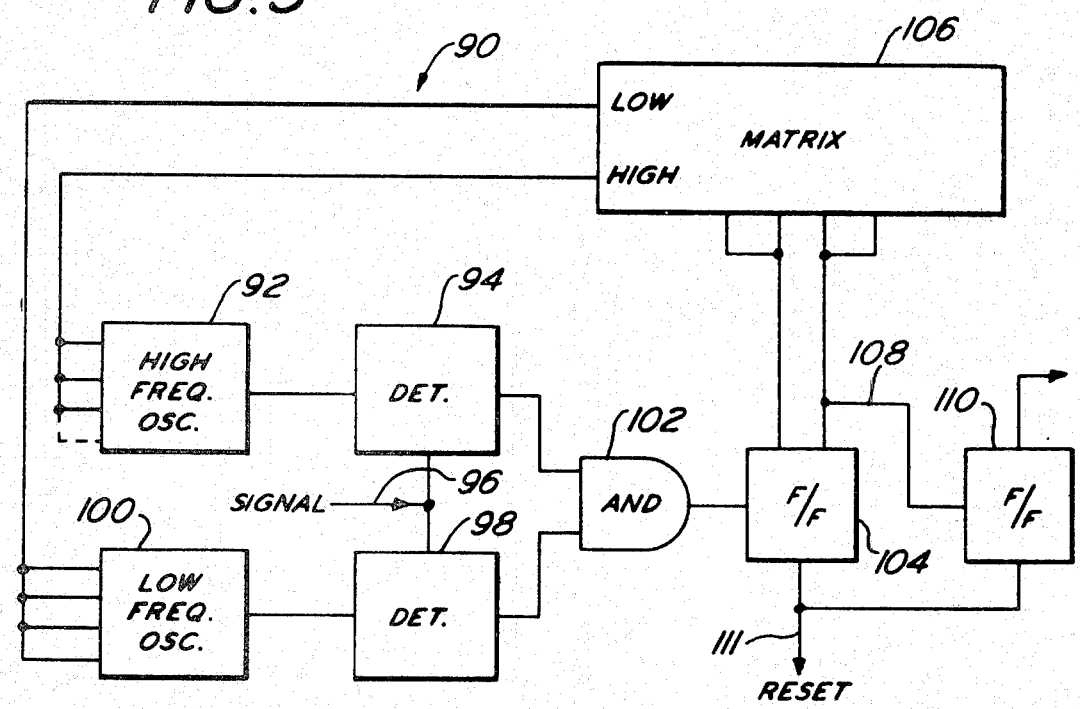
FIG. 3 is a schematic view of a decoding circuit embodying the present invention, this decoding circuit being coupled to the ringer circuit of FIG. 1 for operation thereof.

The system in FIG. 1 is operated by the system shown in FIG. 3. The system of FIG. 3, generally designated 90, comprises a high frequency oscillator 92 which operates at a frequency which is very nearly the same as the frequency to be detected, and its output is fed to one input of a detector 94. The signal received from the compression amplifier 68 is fed through line 96 into the other input of the detector 94 as well as into the input of detector 98.

If any frequency in the signal fed into the detector 94 is substantially the same as the frequency of the oscillator 92, an output is produced by the detector 94. A low frequency oscillator 100 is coupled to detector 98 to feed its output thereinto, and if any frequency in the signal fed into detector 98 is substantially the same as the frequency of the oscillator 100, the detector 98 produces an output.

These outputs of the two detectors 94 and 98 are fed into an AND gate 102. This AND gate operates, therefore, only when the proper high frequency and low frequency signals are simultaneously present. At such time, an output is fed from the AND gate 102 to flip-flop 104. In this manner, to detect a single digit which (as in the case with touch-tones) consists of two frequencies, only two detectors are required to determine if a particular number is present. All other numbers are ignored since they have no relevance. In this manner, if a correct first digit is detected, using an output from the AND gate 102, the flip-flop is caused to toggle from its reset state to its set state. A matrix of standard design, indicated at 106, is employed to determine the frequencies at which the oscillators operate.

When the flip-flop 104 toggles, the oscillators begin to oscillate at a new pair of frequencies, which may be the same as or different from those used previously. A second digit can then be detected in a similar manner to the first, thereby again causing the flip-flop 104 to toggle. When flip-flop 104 toggles a second time, the output is applied through line 108 to set flip-flop 110. This cuts off the transistor 42, thereby preventing the relay 44 from operating, which as a result, permits the phone bell to ring. Another input to flip-flops 104 and 110 indicated at 111, permits resetting the flip-flops, this input corresponding to input 58 in FIG. 1.

Figure 4:
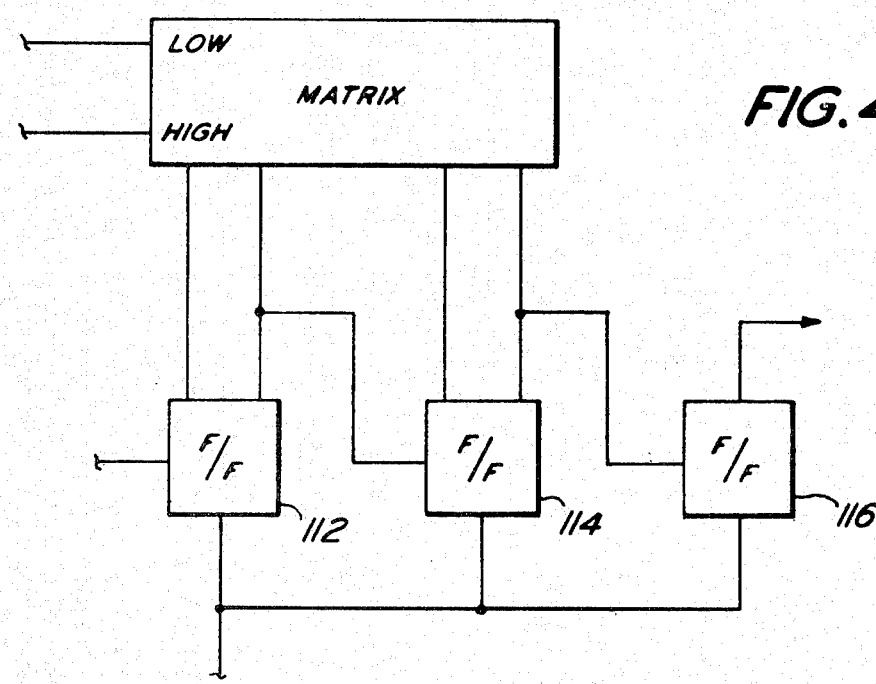
FIG. 4 is a schematic view of a modified portion of the circuit of FIG. 3.

FIG. 4 shows a portion of a system which is the same as in FIG. 3, except for the use of an additional flip-flop to accommodate additional digits, the three flip-flops in this embodiment being designated 112, 114 and 116 respectively. This arrangement would accommodate four digits potentially, but as many flip-flops as desired may be used in accordance with the number of digits in the code.

The original conditions of the flip-flops are determined by resetting them at the beginning of each call. They are reset when a positive voltage is applied to their respective inputs. In this manner, when there is no ringing signal on the line in FIG. 1, capacitor 50 is in a discharged state such that V+ equals Vo and the voltage across capacitor 54 is zero. When a ringing signal appears and capacitor 50 begins charging, if the time constant of capacitor 54 and resistor 56 is long compared to the time constant of resistor 48 and capacitor 50, then the reset voltage on line 58 will be approximately V+ until capacitor 54 charges through resistor 56, at which time the reset line becomes zero volts and the flip-flops are free to operate.

Figure 5:
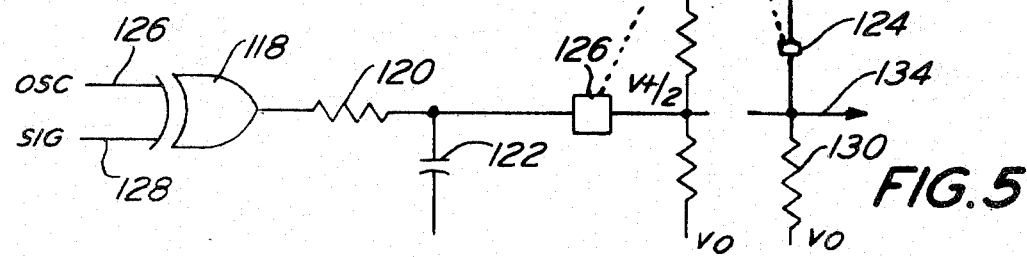
FIG. 5 is a schematic view of the detector circuits used in the systems of FIGS. 3 and 4.

FIG. 5 shows an illustrative embodiment of each of the detectors shown in FIG. 3. Each of these detectors includes an exclusive OR gate 118 coupled to an R-C low-pass filter comprising resistor 120 and capacitor 122 connected to an unvarying reference voltage. The R-C filter is coupled to a normally open relay 126.

In operation, the oscillator is made to produce a rectangular waveform with a 50% duty cycle (square wave) which is applied to one input of the OR gate, as at 126. The signal is applied to the other input, as at 128. The output of the OR gate passes through the low-pass filter which acts as an averaging device. As the output of the OR gate swings through the complete supply voltage applied to the gate, then, in the absence of a signal, the output of the low-pass filter equals one-half the supply voltage because of the 50% duty cycle.

When a signal is applied, beat notes (sum and difference frequencies) appear at the output of the low-pass filter. Since the low-pass filter passes only low frequencies, the sum frequency is very small and may be ignored. The closer the frequencies of the oscillator input and signal are to each other, the lower will be the difference frequency beat note and because of the presence of the low-pass filter, the larger will be the amplitude of the beat note issuing from the filter.

The output of the low-pass filter is connected to a detector which detects any excursion of the output of the filter from one-half the supply voltage. This is accomplished in the system shown in FIG. 5 by connecting one end of the coil of a normally open relay 126 to a fixed one-half of the supply voltage and the other end of the coil to the output of the filter. The output of the circuit is indicated at 134, and this output is caused to be positive by the contacts 124 of the relay 126.

Alternatively, a bipolar exclusive OR gate could be used in place of relay 126.

Figure 6:
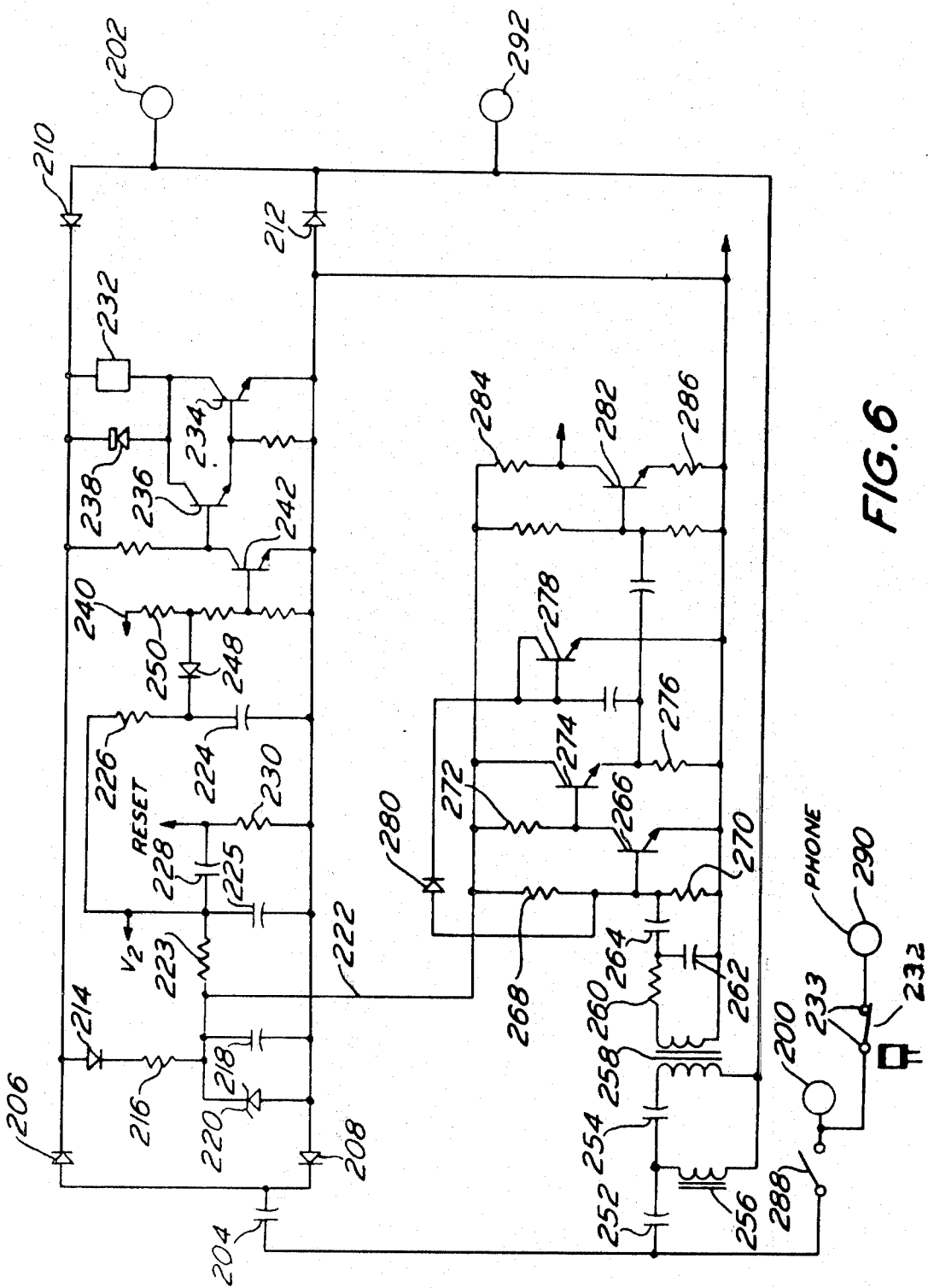
FIG. 6 is a schematic view of a specific embodiment of the bell-deactivating system shown in FIG. 1.

FIG. 6 and the figures following show a more detailed embodiment of the present invention. In this embodiment, the upper portion of FIG. 6 corresponds to the left portion of FIG. 1. Terminals 200 and 202 are connected to the phone line such that if switch 288 is closed when a ringing signal appears on the line, it is passed through a capacitor 204 to a set of four diodes, respectively designated as 206, 208, 210 and 212, connected as a bridge rectifier. The signal is tapped off through a diode 214 in series with a resistor 216 to charge capacitor 218. A Zener diode 220 limits the voltage to which the capacitor 218 can charge. The series combination of the capacitor 204 and resistor 216 determines the amount of current taken from the phone line. Voltage from the capacitor 218 is coupled both to a compression amplifier through line 222 and through a resistor 223 to a capacitor 225 which provides power indicated as $V_2$ for all the other circuits. A capacitor 228 and a series resistor 230 are coupled off from $V_2$ to establish a reset voltage.

During the ringing signal, the pulsating DC voltage is also applied through relay 232 in series with transistors 234 and 236. A diode 238 is connected in parallel with relay 232 to prevent excessive voltage spikes during collapse of the magnetic field in the relay coil.

When the first ringing signal appears on the phone line, if it is incomplete (i.e. less than 2 seconds), the voltage $V_2$ may not become sufficiently established for the logic circuits to have voltage to properly establish their states. Under such conditions, the output at 240 may become temporarily positive. This would cause transistor 242 to turn on and transistor 234 to turn off, whereby the relay 232 would not operate to prevent the bell from ringing. In order to prevent this from happening, the capacitor 224, which is coupled to $V_2$ through resistor 226 and to the output 240 through diode 248 and resistor 250, is initially in a discharged state and acts through the diode 248 to prevent the transistor 242 from turning on until $V_2$ can become established. In other words, the time constant of the capacitor 224 and the resistor 226 is longer than the time constant of the resistor 216 and the capacitors 218 and 225.

The lower portion of FIG. 6 corresponds to the filter and compression amplifier position of FIG. 1 and includes a capacitor 252, a capacitor 254 and an inductor 256 in a standard Chebychev high-pass filter arrangement which eliminates the standard 20-Hz ringing signal from the input to the compression amplifier. Considerable attenuation takes place since the 20-Hz ringing signal is typically 250 volts peak-to-peak. Transformer 258, followed by a resistor 260 and capacitor 262, provides additional filtering.

The compression amplifier includes a capacitor 264 through which the signal is applied to the base of a transistor 266 which is initially biased by resistors 268 and 270 as a standard small signal amplifier where the voltage gain is determined by the ratio of a collector resistor 272 to the transistor emitter resistance. The emitter resistance is inversely proportional to the base voltage. In this manner, any decrease in base voltage will cause an increase in emitter resistance and a decrease in voltage gain.

The transistor 266 is coupled to a transistor 274 which serves as a standard emitter follower to permit impedance amplification that allows the use of a large collector resistor 272 for transistor 266, thereby reducing the current taken from the capacitor 218. The output of the emitter follower is capacitively coupled to a standard voltage doubler circuit consisting of transistor 278 connected as a diode plus a standard series diode 280. The capacitor 264 acts as a filter capacitor for the voltage doubler in addition to its other input coupling duties.

The voltage doubler circuit is arranged to produce a negative voltage so that when the signal on the emitter of transistor 274 increases, a negative DC voltage is produced across the capacitor 264 and on the base of transistor 266, thereby causing the gain of the transistor stage 266 to decrease. Since the action is logarithmic, a change in voltage at the input of the amplifier by a factor of 200 causes a change of less than 25% at the amplifier's output. A transistor 282 and its associated resistors 284 and 286 form a standard audio-frequency amplifier.

The NC contacts 233 of relay 232 are connected in series with the phone instrument which is connected between terminals 292 and 290. When SW 288 is open, any ringing signal on terminal 200 is disconnected from the bridge networks 200, 208, 210 and 212 so that no signal is applied across the coil of relay 232. The contacts of relay 232 then remain closed connecting terminals 200 and 290 together so that the user of the phone observes no difference from when the unit is not connected to the telephone instrument since electrically there is no difference.

Figure 7:
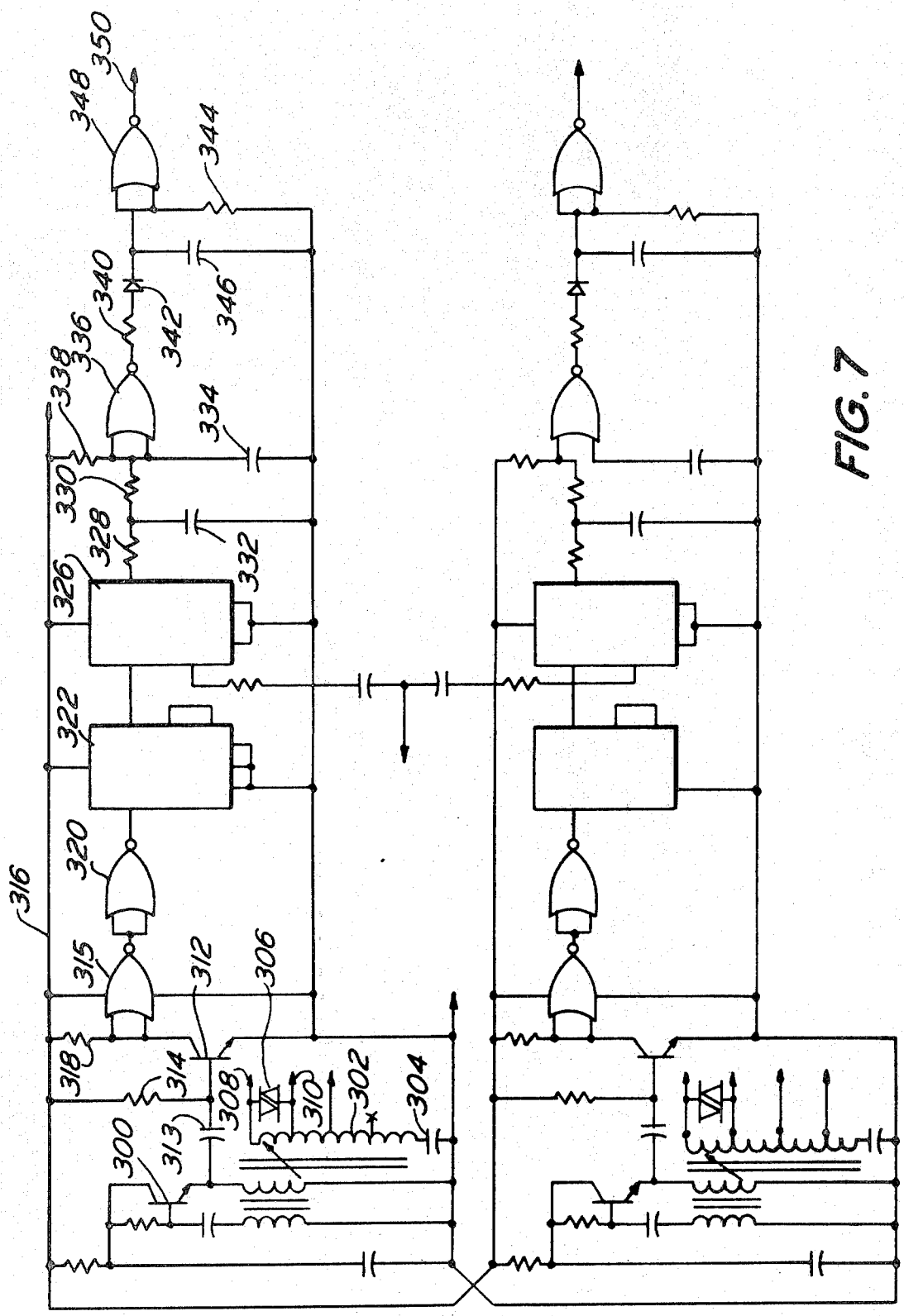
FIG. 7 is a schematic view of a specific embodiment of the oscillator and detector means shown in FIG. 3.

The upper and lower portions of FIG. 7, the upper portion serving as the high frequency group detection and the lower portion serving as the low frequency group detection, are schematically identical so that a description of the upper portion serves as a description of the lower portion as well. As shown, the transistor 300, transformer 302, and their associated components, comprise a standard emitter-coupled feedback oscillator with its frequency being determined by the inductance of a tertiary winding on the transformer 302 and by a capacitor 304. The diac 306 between leads 308 and 310 determines the amplitude of oscillation. Transistor 312 and its associated components such as capacitors 313 and resistor 314 operates as a standard buffer amplifier. The collector of transistor 312 is coupled to the input of NAND gate 315 connected to line 316 through a biasing resistor 318, the output of the NAND gate 315 being coupled to the input of NAND gate 320. The inverter gates operate as limiters to provide a fast rise time oscillation from the oscillator for presentation to a toggling flip-flop 322.

The oscillator operates at double the desired frequency so that the output of the toggling flip-flop will be at the desired frequency with a duty cycle that is extremely close to 50% (within the noise limitations of the toggling flip-flop). The square wave from the flip-flop 322 and the signal are applied to the two inputs of an exclusive OR gate 326, the output of which is connected to a low-pass filter consisting of two resistors 328 and 330, a capacitor 332 and a capacitor 334. The output of the low-pass filter is connected to a NAND gate 336 which is used as a threshold detector and is biased by a resistor 338.

If no signal is present or no frequency in a signal is present which produces a beat note within twice the cutoff frequency of the low-pass filter, the output of the threshold detector is a logic "O". If such a frequency is present in the signal to product a beat note of less than twice the cutoff frequency of the low-pass filter, then the output of the threshold detector, in synchronism with the beat note, periodically presents a logic level "1". Optionally, a bipolar detector may be used.

The gate 336 is coupled to a resistor 340 which, when combined with a diode 342, a resistor 344 and a capacitor 346, constitutes a shaped low-pass filter which, when monitored by a NAND gate 348 used as a threshold detector, causes a continuous logic "O" level to be present at output 350 when a frequency component of the signal is within twice the cutoff frequency of the low-pass filter of the oscillator frequency.

Figure 8:
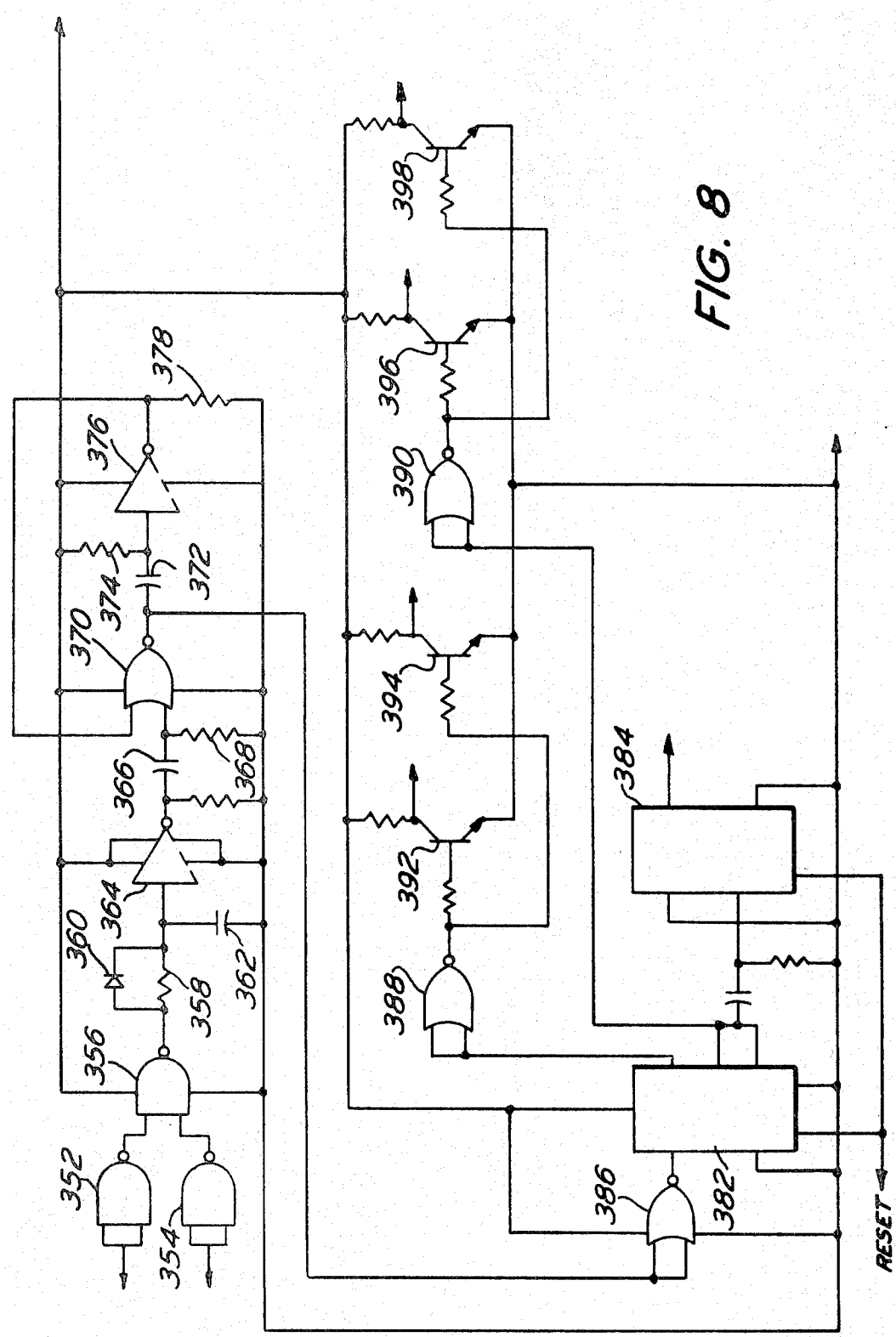
FIG. 8 is a schematic view of a specific embodiment of the coding means shown in FIG. 3.

As seen in FIG. 8, the outputs of the high and low frequency detectors are passed through inverters 352 and 354 to a NAND gate 356 followed by a resettable monostable consisting of a resistor 358, a diode 360, a capacitor 362 and a threshold detector 364 is a logic "1" if and only if both frequencies to be detected are simultaneously present for a period of time at least as long as that set by the resettable monostable.

The resettable monostable is followed by a non-resettable monostable to eliminate any switching transients by means of a positive feedback. This non-resettable monostable consists of a capacitor 366, a resistor 368, a NAND gate 370, a capacitor 372, a resistor 374, a threshold detector 376 and a resistor 378. The inverters 364 and 376 are partially respresented by a broken line to indicate that they are non-complimentary MOS employing a resistor in place of the normal complimentary resistor. By this means, each monostable requires only 5 microamperes for operation as compared to several milliamperes for standard complimentary configurations.

The output of non-resettable monostable is passed through another NAND gate 386, connected as an inverter, which is also used as a limiter. In addition, the output is passed to the flip-flop 382 corresponding to flip-flop 104 in FIG. 3. This flip-flop is also used to set flip-flop 384 corresponding to flip-flop 110 in FIG. 3.

The complimentary outputs of the toggling flip-flop are also passed through NAND gates 386, 388 and 390, which are connected as inverters and used as buffers, the outputs of which bias the respective transistors 392, 394, 396 and 398 into saturation or cutoff. The collectors of these four transistors are connected to a matrix of connectors 106, (the connection being of standard construction and not shown). The remaining terminals of the matrix are connected to the appropriate leads on the high and low frequency transformers shown in FIG. 7. Therefore, when transistors 392 and 394 are in saturation, one pair of oscillator frequencies is chosen, while when transistors 396 and 398 are in saturation, with transistors 392 and 394 in cutoff, a second pair is chosen.

Although the above-described system has been disclosed in use with telephone-bell blocking arrangement, it is not necessarily limited to such use but can be used in any system to determine whether or not a predetermined frequency component is present in a signal.

The invention claimed is:

1. A compression amplifier comprising a first transistor biased as an amplifier where the voltage gain is determined by emitter current which is inversely proportional to the base voltage, whereby any decrease in base voltage causes an increase in voltage gain, said first transistor being coupled through a second transistor connected as an emitter follower directly to a peak-to-peak detector circuit adapted to produce a decreasing voltage when the average peak-to-peak amplitude of the signal at the collector of said first transistor is greater than a threshold determined by said detector circuit and to produce an increasing voltage when the average peak-to-peak amplitude of the signal at said collector is less than a threshold determined by said detector circuit, said detector circuit being coupled to the base of first transistor whereby the voltage gain of said first transistor is caused to adjust itself such that the peak-to-peak amplitude of the signal reproduced at the collector of said first transistor is substantially determined solely by the characteristics of said detector circuit.

2. The compression amplifier of claim 1 wherein said detector circuit is a voltage doubler.

* * * * *